(12) United States Patent
Yan et al.

(10) Patent No.: US 11,837,890 B2
(45) Date of Patent: Dec. 5, 2023

(54) CHARGING PILE, POWER DISTRIBUTION SYSTEM AND POWER DISTRIBUTION METHOD THEREOF

(71) Applicant: Delta Electronics (Shanghai) Co., Ltd., Shanghai (CN)

(72) Inventors: Chao Yan, Shanghai (CN); Huafeng Chen, Shanghai (CN)

(73) Assignee: DELTA ELECTRONICS (SHANGHAI) CO., LTD., Shanghai (CN)

(*) Notice: Subject to any disclaimer, the term of this patent is extended or adjusted under 35 U.S.C. 154(b) by 312 days.

(21) Appl. No.: 17/167,066

(22) Filed: Feb. 3, 2021

(65) Prior Publication Data

US 2021/0273460 A1  Sep. 2, 2021

(30) Foreign Application Priority Data

Feb. 27, 2020 (CN) .......................... 202010124644.7

(51) Int. Cl.
*H02J 7/00* (2006.01)
*B60L 53/302* (2019.01)
(Continued)

(52) U.S. Cl.
CPC .......... *H02J 7/0013* (2013.01); *H02J 7/0047* (2013.01); *B60L 53/16* (2019.02); *B60L 53/302* (2019.02); *H05K 7/20218* (2013.01)

(58) Field of Classification Search
CPC ....................................................... B60L 53/31
See application file for complete search history.

(56) References Cited

U.S. PATENT DOCUMENTS

2019/0337406 A1* 11/2019 Mingenbach ........... H02J 1/102

FOREIGN PATENT DOCUMENTS

CN 107031437 A * 8/2017
CN 107031437 A 8/2017
(Continued)

OTHER PUBLICATIONS

Liu CN107031437 translation (Year: 2017).*
Hong CN110228390 translation (Year: 2019).*

*Primary Examiner* — Drew A Dunn
*Assistant Examiner* — Tynese V McDaniel
(74) *Attorney, Agent, or Firm* — CKC & Partners Co., LLC

(57) ABSTRACT

A charging pile includes a plurality of charging guns and a single heat dissipation module. The plurality of charging guns is connected to the heat dissipation module for heat dissipation via heat exchange. A power distribution system for the charging pile includes: a power module for supplying power to the plurality of charging guns; a control unit connected to the power module and the heat dissipation module for determining an output current of each charging gun depending on the maximum heat dissipation power $P_{loss}$Max of the heat dissipation module and the maximum heat loss $P_{charger}$Max of each charging gun when the plurality of charging guns charge simultaneously; and a power distribution unit connected to the power module and the control unit for distributing the power supplied by the power module to a device through a charging gun connected thereto depending on the output current of that charging gun.

21 Claims, 5 Drawing Sheets

(51) Int. Cl.
 *B60L 53/16* (2019.01)
 *H05K 7/20* (2006.01)

(56) References Cited

FOREIGN PATENT DOCUMENTS

| | | | | |
|---|---|---|---|---|
| CN | 206932518 | U | | 1/2018 |
| CN | 108340805 | A | | 7/2018 |
| CN | 110103759 | A | | 8/2019 |
| CN | 110228390 | A | * | 9/2019 |
| CN | 110228390 | A | | 9/2019 |
| CN | 110549894 | A | | 12/2019 |
| EP | 3726691 | A1 | * | 10/2020 .............. B60L 53/54 |

* cited by examiner

500

| determining, by a control unit, an output current of each of a plurality of charging guns depending on the maximum heat dissipation power of a heat dissipation module and the maximum heat loss of each charging gun when the plurality of charging guns charges simultaneously, wherein the maximum heat dissipation power of the heat dissipation module is equal to or larger than the maximum heat loss of any one of the charging guns, and is less than a sum of the maximum heat loss of the plurality of charging guns | S51 |

| distributing, by a power distribution unit, power supplied by a power module to a device to be charged through a corresponding charging gun depending on the output current of that charging gun | S52 |

Fig. 5

CHARGING PILE, POWER DISTRIBUTION SYSTEM AND POWER DISTRIBUTION METHOD THEREOF

CROSS-REFERENCE TO RELATED APPLICATIONS

This non-provisional application claims priority under 35 U.S.C. § 119(a) on Patent Application No. 202010124644.7 filed in P.R. China on Feb. 27, 2020, the entire contents of which are hereby incorporated by reference.

Some references, if any, which may include patents, patent applications and various publications, may be cited and discussed in the description of this disclosure. The citation and/or discussion of such references, if any, is provided merely to clarify the description of the present disclosure and is not an admission that any such reference is "prior art" to the disclosure described herein. All references listed, cited and/or discussed in this specification are incorporated herein by reference in their entireties and to the same extent as if each reference was individually incorporated by reference.

BACKGROUND

1. Field of the Disclosure

The disclosure relates to a charging pile, and in particular, to a charging pile, and a power distribution system as well as a power distribution method thereof.

2. Related Art

Currently, some of the large power charging piles are equipped with a single charging gun (short for "a single gun"), and some are equipped with two charging guns (short for "double guns"). However, heat dissipation of the charging guns is basically separate (i.e., one charging gun corresponding to one heat dissipation module).

As for current application, the charging piles are in a state of "non-full power" charging demand for most of time. Therefore, as for a large power single gun system, efficiency of the system is low. As for a large power double gun system, both of the guns use a separate heat dissipation module. Firstly, the charging guns are heavy, and secondly, a use ratio of the heat dissipation modules of the charging guns is low, resulting in a low heat dissipation efficiency of the system.

Therefore, it is urgent to provide a charging pile with high output efficiency and high heat dissipation efficiency.

SUMMARY

An object of the disclosure is to provide a charging pile, and a power distribution system as well as a power distribution method thereof, which can effectively improve output efficiency and heat dissipation efficiency of the charging pile by sharing one heat dissipation module among a plurality of charging guns, and dynamically controlling output currents of respective charging guns.

To realize the above object, the disclosure provides a power distribution system of a charging pile, wherein the charging pile comprises a plurality of charging guns and a single heat dissipation module, all of the plurality of charging guns being connected to the heat dissipation module for heat dissipation, the power distribution system comprises:

a power module for supplying power to the plurality of charging guns;

a control unit connected to the power module and the heat dissipation module, and configured to determine, when the plurality of charging guns charge simultaneously, an output current of each charging gun depending on a maximum heat dissipation power $P_{loss}$Max of the heat dissipation module and a maximum heat loss $P_{charger}$Max of each charging gun, wherein the maximum heat dissipation power $P_{loss}$Max of the heat dissipation module is equal to or larger than the maximum heat loss of any charging gun, and is less than a sum of the individual maximum heat loss of each charging gun; and a power distribution unit connected to the power module and the control unit for distributing the power supplied by the power module to a device through the charging gun connected thereto depending on the output current of each charging gun.

To realize the above object, the disclosure further provides a power distribution method for a charging pile, wherein the charging pile comprises a plurality of charging guns and a single heat dissipation module, all of the plurality of charging guns being connected to the heat dissipation module for heat dissipation, the power distribution method comprising:

determining, by a control unit, an output current of each charging gun depending on a maximum heat dissipation power $P_{loss}$Max of the heat dissipation module and a maximum heat loss $P_{charger}$Max of each charging gun when the plurality of charging guns charge simultaneously, wherein the maximum heat dissipation power $P_{loss}$Max of the heat dissipation module is equal to or larger than the maximum heat loss of any charging gun, and is less than a sum of the individual maximum heat loss of each charging gun; and distributing, by a power distribution unit, power supplied by a power module to a device through the charging gun connected thereto depending on the output current of each charging gun.

To realize the above object, the disclosure further provides a charging pile comprising a plurality of charging guns and a single heat dissipation module, all of the plurality of charging guns being connected to the heat dissipation module for heat dissipation via heat exchange, wherein the charging pile comprises the above power distribution system.

The disclosure can ensure utilization of the heat dissipation module to the maximum extent by sharing one heat dissipation module among a plurality of charging guns, and dynamically controlling output currents of respective charging guns, such that an output efficiency and a heat dissipation efficiency of the charging pile can be effectively improved.

The additional aspects and advantages of the disclosure are partially explained in the below description, and partially becoming apparent from the description, or can be obtained through practice of the disclosure.

BRIEF DESCRIPTION OF THE DRAWINGS

The exemplary embodiments will be described in detail with reference to the accompanying drawings, through which the above and other features and advantages of the disclosure will become more apparent.

FIG. 5 is a flow chart of a power distribution method of the charging pile according to the disclosure.

DETAILED EMBODIMENTS

Figure 1:
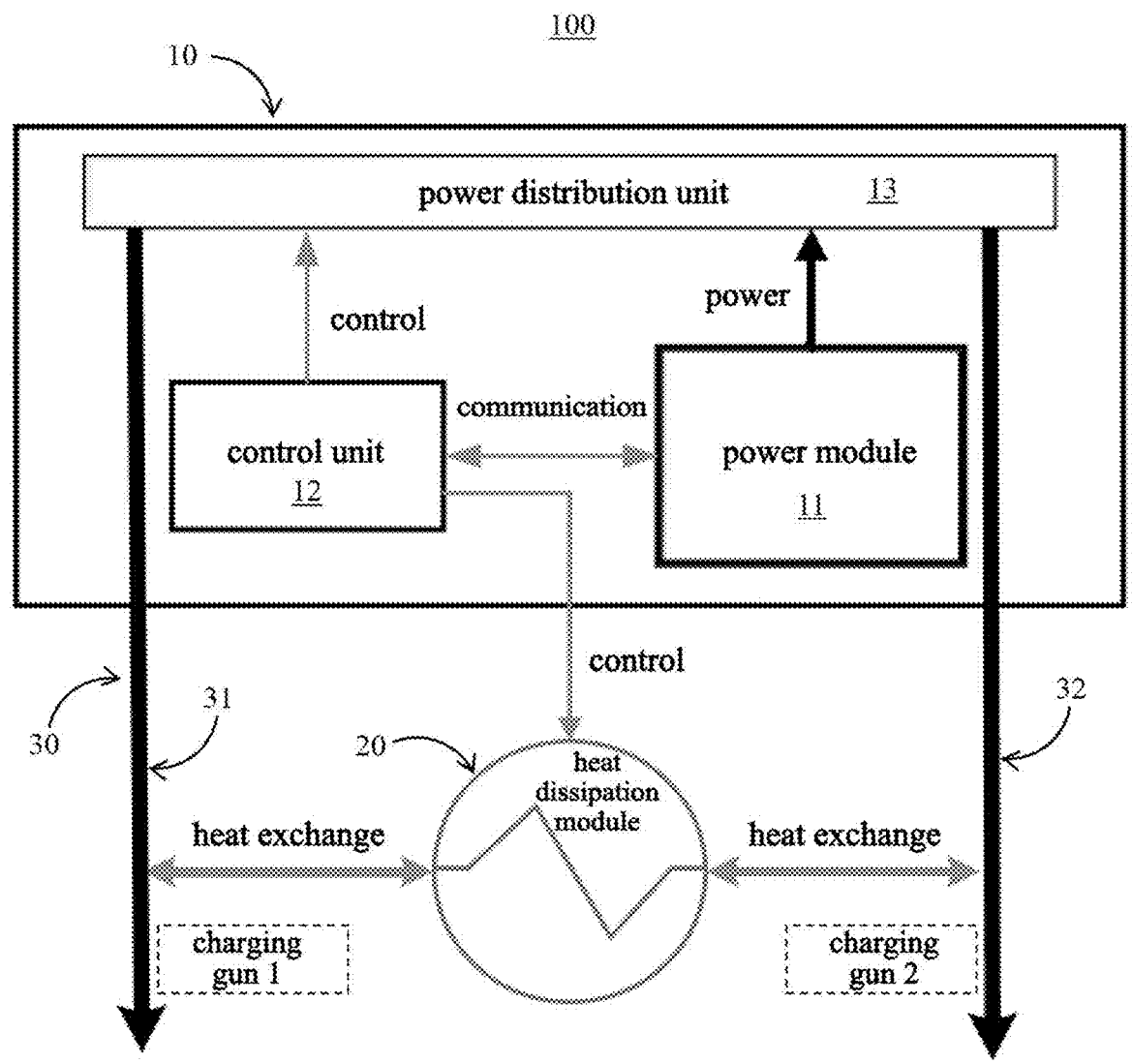
FIG. 1 is a structural diagram of a charging pile equipped with double guns and a power distribution system thereof according to one embodiment of the disclosure.

The exemplary embodiments will now be described more fully with reference to the accompanying drawings. However, the exemplary embodiments can be implemented in various forms and shall not be understood as being limited to the embodiments set forth herein; on the contrary, these embodiments are provided so that this disclosure will be thorough and complete, and the conception of exemplary embodiments will be fully conveyed to those skilled in the art. In the drawings, the same reference numeral denotes the same or similar structure, so their detailed description will be omitted.

When factors/components/the like described and/or illustrated here are introduced, the phrases "one", "a(an)", "the", "said" and "at least one" refer to one or more factors/components/the like. The terms "include", "comprise" and "have" refer to an open and included meaning, and refer to additional factors/components/the like, in addition to the listed factors/components/the like. The embodiments may use relative phrases, such as, "upper" or "lower" to describe a relative relation of one signed component over another component. It should be understood that if the signed device reverses to turn upside down, the described component on an "upper" side will become a component on a "lower" side. In addition, the terms "first", "second" and the like in the claims are only used as signs, instead of numeral limitations to objects.

FIG. 1 illustrates a structure of a charging pile 100 equipped with double guns and a power distribution system 10 thereof in one preferable embodiment of the disclosure. The charging pile 100 comprises two charging guns 30, i.e., a first charging gun 31 (charging gun 1) and a second charging gun 32 (charging gun 2). These charging guns 30 are connected to a single heat dissipation module 20 for heat dissipation via heat exchange. The heat dissipation module 20 may be a liquid cooling heat dissipation module, for example. It should be understood that although FIG. 1 illustrates two charging guns 30, in other embodiments, the charging pile 100 may also comprise three or more charging guns, but the disclosure is not limited thereto.

In this embodiment, the charging pile 100 further comprises a power distribution system 10, which includes, for example, a power module 11, a control unit 12 and a power distribution unit 13. The power module 11 may supply power to the two charging guns 30. The control unit 12 may be connected to the power module 11 and the heat dissipation module 20, and be configured to determine an output current of each charging gun depending on the maximum heat dissipation power $P_{loss}$Max of the heat dissipation module 20 and the maximum heat loss $P_{charger}$Max of each charging gun when the two charging guns 30 charge simultaneously, wherein the maximum heat dissipation power $P_{loss}$Max of the heat dissipation module 20 is equal to or larger than the maximum heat loss of any one of the charging guns, and less than a sum of the individual maximum heat loss of the two charging guns 30. The power distribution unit 13 may be connected to the power module 11 and the control unit 12, and be configured to distribute the power supplied by the power module 11 to a device to be charged (not shown) through a charging gun 30 connected thereto depending on the output current of the charging gun.

In this embodiment, the control unit 12 is in communication connection to the power module 11, and in control connection to the power distribution unit 13 and the heat dissipation module 20. The device to be charged may include but is not limited to electric vehicles.

In this embodiment, the control unit 12 may be further configured to determine an output current of a charging gun depending on a request current of the charging gun when the single charging gun charges, wherein the request current of the charging gun is a demand current of the device connected thereto.

In some embodiments, when the charging pile 100 transits from charging with the single gun to charging with the double guns simultaneously, the control unit 12 is further configured to implement initialization of an individual output current of each of the two charging guns 30 by evenly distributing or real-time distributing (which will be described in detail later) the output currents of two charging guns.

In some embodiments of the present disclosure, as for the charging gun 30 (including cables and heads) of the charging pile 100, in the case of a certain length, its resistance value is a constant value R, wherein R varies depending on temperature.

Taking the charging pile 100 equipped with double guns (or referred as "a double gun charging system") in FIG. 1 as an example, assuming that resistance values of the double guns in a room temperature (T0) are $R1_{T0}$ and $R2_{T0}$, respectively, when the system has been charged for a period of time, temperature of the cables is raised to T1, and the resistance values of the double guns become $R1_{T1}$ and $R2_{T1}$, respectively, as in the following formulas:

$$R1_{T1} = R1_{T0}(1+\alpha T1) \quad \text{(Formula 1)}$$

$$R2_{T1} = R2_{T0}(1+\alpha T1) \quad \text{(Formula 2)}$$

wherein $\alpha T1$ is a value larger than 0. As for a charging pile having heat dissipation capability, the charging pile can be ensured to always work in the maximum output capability under the control algorithm proposed in the present disclosure.

Taking the charging pile 100 equipped with double guns shown in FIG. 1 as an example, the maximum heat dissipation power of the heat dissipation module 20 is defined as $P_{loss}$Max, resistances of the first charging gun 31 and the second charging gun 32 are defined as $R1_{cable}$ and $R2_{cable}$, respectively, the maximum allowable output currents of the first charging gun 31 and the second charging gun 32 are defined as $I1_{available}$Max and $I2_{available}$Max respectively, and the maximum heat loss of the charging gun is defined as $P_{charger}$Max, then the maximum heat loss of the first charging gun 31 is $P1_{charger}$Max$= I1_{available}^2$Max$*R1_{cable}$, the maximum heat loss of the second charging gun 32 is $P2_{charger}$Max$= I2_{available}^2$Max$*R2_{cable}$ and the above parameters satisfy:

$$\{I1_{available}^2\text{Max}*R1_{cable}, I2_{available}^2\text{Max}*R2_{cable}\}\text{Max} \leq P_{loss}\text{Max and}$$

$$P_{loss}\text{Max} \leq (I1_{available}^2 \text{Max} * R1_{cable} + I2_{available}^2 \text{Max} * R2_{cable}) \quad \text{(Formula 3)}$$

The formula (3) shows that the maximum heat dissipation power of the heat dissipation module 20 is equal to or larger than the maximum heat loss of any one of the double charging guns, and is less than a sum of the individual maximum heat loss of the double guns.

If the specifications of the first charging gun 31 and the second charging gun 32 in the double gun charging system shown in FIG. 1 are the same, then.

$$R1_{cable} = R2_{cable} \text{ and } I1_{available}\text{Max} = I2_{available}\text{Max}$$

A resistance of the charging gun is defined as $R_{cable}$, the maximum allowable output current of the charging gun is defined as $I_{available}\text{Max}$, so the above formula (3) can be simplified to be:

$$I_{available}^2\text{Max} * R_{cable} \leq P_{loss}\text{Max} < 2I_{available}^2\text{Max} * R_{cable} \quad \text{(Formula 4)}$$

Moreover, when the maximum allowable output current $I_{available}\text{Max}$ and the resistance $R_{cable}$ of the respective double guns are the same, the maximum heat loss $P_{charger}\text{Max}$ of each charging gun satisfies the following formula:

$$P_{charger}\text{Max} = I_{available}^2\text{Max} * R_{cable} \quad \text{(Formula 5)}$$

When the double gun charging system shown in FIG. 1 are charging, output currents $I1_{available}$ and $I2_{available}$ of the double guns change dynamically, and satisfy the following relations:

$$I1_{available}^2 * R_{cable} + I2_{available}^2 * R_{cable} \leq P_{loss}\text{Max} \quad \text{(Formula 6)}$$

i.e. $I1_{available}^2 + I2_{available}^2 \leq P_{loss}\text{Max}/R_{cable}$ (Formula 17)

Figure 2:
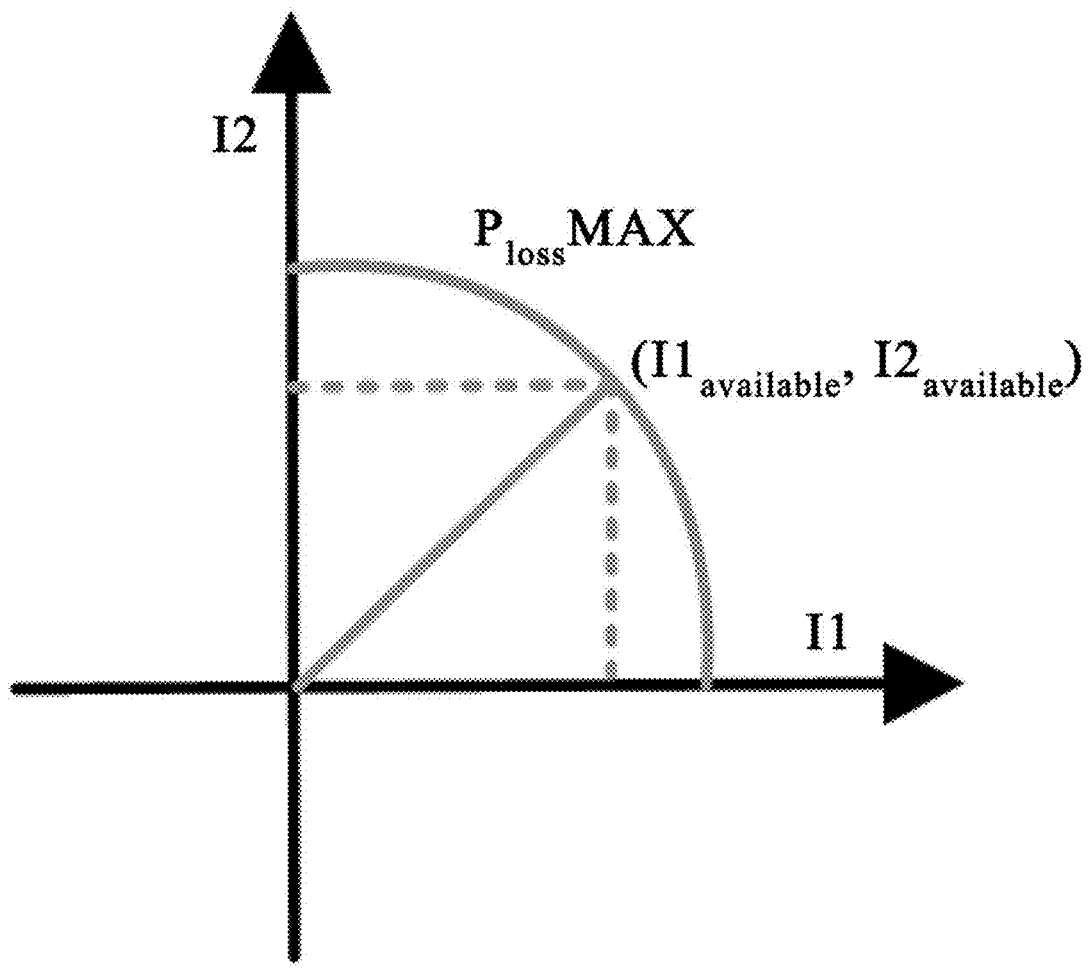
FIG. 2 is a schematic diagram of the dynamic change between the maximum heat dissipation power $P_{loss}$Max of the heat dissipation module and output currents of the double guns of the charging pile equipped with double guns according to the disclosure.

FIG. 2 illustrates relational function of the above formula (7), that is, the dynamic change relationship between the maximum heat dissipation power $P_{loss}\text{Max}$ of the heat dissipation module and the output currents $I1_{available}$ and $I2_{available}$ of the double guns is shown. As can be seen from FIG. 2, when a value is at coordinates shown in the figure, the output current of the double gun charging system is maximum. At this time, the output currents $I1_{available}$ and $I2_{available}$ of the double guns satisfy:

$$I1_{available} = I2_{available} = \sqrt{\frac{P_{loss}\text{Max}}{2R_{cable}}} \quad \text{(Formula 8)}$$

In this embodiment, when the double gun charging system shown in FIG. 1 transits from charging with a single charging gun (i.e., single gun mode) to charging with the two charging guns simultaneously (i.e., double gun mode), the control unit 12 may be further configured to implement initialization of output currents of the two charging guns by evenly distributing or real-time distributing the output currents of the charging guns. When initialization is finished, the double gun charging system can charge stably with the two charging guns simultaneously.

Figure 3:
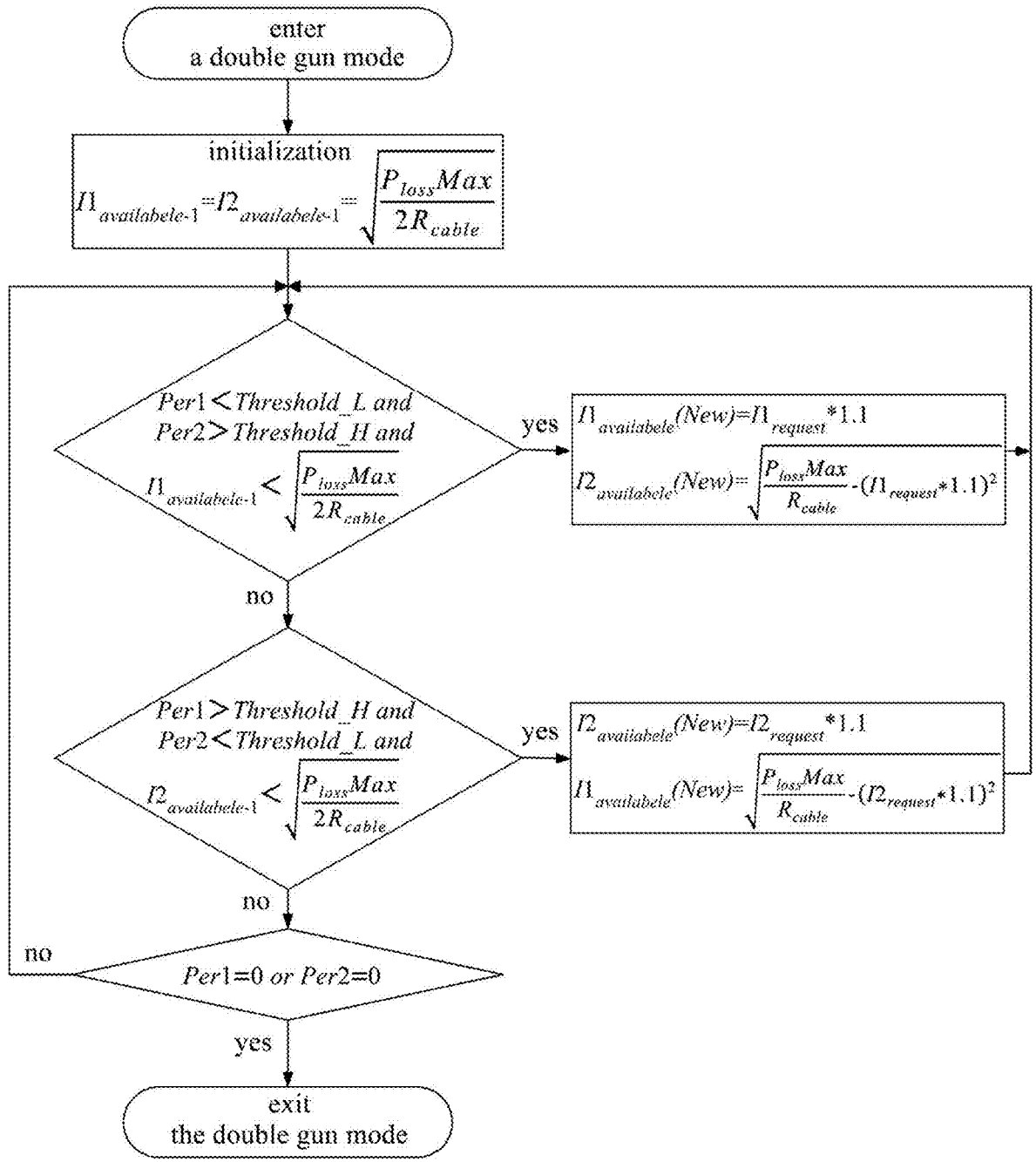
FIG. 3 is a flow chart of initializing the output currents of the double guns by evenly distribution when the charging pile equipped with double guns enters into a double gun mode from a single gun mode according to the disclosure.

FIG. 3 illustrates process of initializing the output currents of the double guns by evenly distribution when the double gun charging system shown in FIG. 1 enters from the single gun mode to the double gun mode. Assuming that the first charging gun 31 is the charging gun that has been charging, the second charging gun 32 is the charging gun entering into charging.

In FIG. 3, a request current of the charging gun 1 is defined as $I1_{request}$, an initial output current is defined as $I1_{available-1}$, and a ratio is defined as Per1, i.e., $$Per1 = \frac{I1_{request}}{I1_{available-1}}.$$

A request current of the charging gun 2 is defined as $I2_{request}$, an initial output current is defined as $I2_{available-1}$, and a ratio is defined as Per2, i.e., $$Per2 = \frac{I2_{request}}{I2_{available-1}}.$$

A first current adjustment coefficient threshold is defined as Threshold_H, which may be, for example, 0.95. A second current adjustment coefficient threshold is defined as Threshold_L, which may be, for example, 0.80.

When the second charging gun 32 enters into charging, the charging pile enters into the double gun mode from the single gun mode, and the respective output currents of the first charging gun 31 and the second charging gun 32 are initialized firstly. For example, during the respective output currents of the first charging gun 31 and the second charging gun 32 are initialized, the control unit 12 may determine an initial output current of each charging gun depending on the maximum heat dissipation power $P_{loss}\text{Max}$ of the heat dissipation module 20 and the resistance $R_{cable}$ of each charging gun. If the initial output current of the first charging gun 31 is $I1_{available-1}$, and the initial output current of the second charging gun 32 is $I2_{available-1}$, then $$I1_{available-1} = I2_{available-1} = \sqrt{\frac{P_{loss}\text{Max}}{2R_{cable}}},$$

i.e., the output currents of the double guns are evenly distributed.

After initialization, the control unit 12 may determine the output current of each charging gun depending on a request current of each of the two charging guns 30, a first current adjustment coefficient threshold Threshold_H, a second current adjustment coefficient threshold Threshold_L, the maximum heat dissipation power $P_{loss}\text{Max}$ of the heat dissipation module 20 and a resistance $R_{cable}$ of each charging gun, wherein the first current adjustment coefficient threshold Threshold_H is larger than the second current adjustment coefficient threshold Threshold_L, such that the devices to be charged can be charged simultaneously by the respective charging gun connected thereto depending on the determined output current.

More specifically, when the first charging gun 31 and the second charging gun 32 charge simultaneously, if the first charging gun 31 has a request current of $I1_{request}$ and an initial output current of $I1_{available-1}$, with a ratio of Per1; and if the second charging gun 32 has a request current of $I2_{request}$ and an initial output current of $I2_{available-1}$, with a ratio of Per2, then:

if Per1<Threshold_L, Per2>Threshold_H, and $$I1_{available-1} < \sqrt{\frac{P_{loss}\text{Max}}{2R_{cable}}},$$

then $I1_{available}(\text{New}) = I1_{request} * 1.1$, and $$I2_{available}(\text{New}) = \sqrt{\frac{P_{loss}\text{Max}}{R_{cable}} - (I1_{request} * 1.1)^2};$$

if Per1>Threshold_L, Per2<Threshold_H, and $$I2_{available-1} < \sqrt{\frac{P_{loss}\text{Max}}{2R_{cable}}},$$

then $I2_{available}(\text{New}) = I2_{request} * 1.1$, and $$I1_{available}(\text{New}) = \sqrt{\frac{P_{loss}\text{Max}}{R_{cable}} - (I2_{request} * 1.1)^2};$$

wherein $I1_{available}(\text{New})$ is an updated output current of the first charging gun 31, and $I2_{available}(\text{New})$ is an updated output current of the second charging gun 32.

Moreover, when Per1=0, or Per2=0, the system exits the double gun mode.

Figure 4:
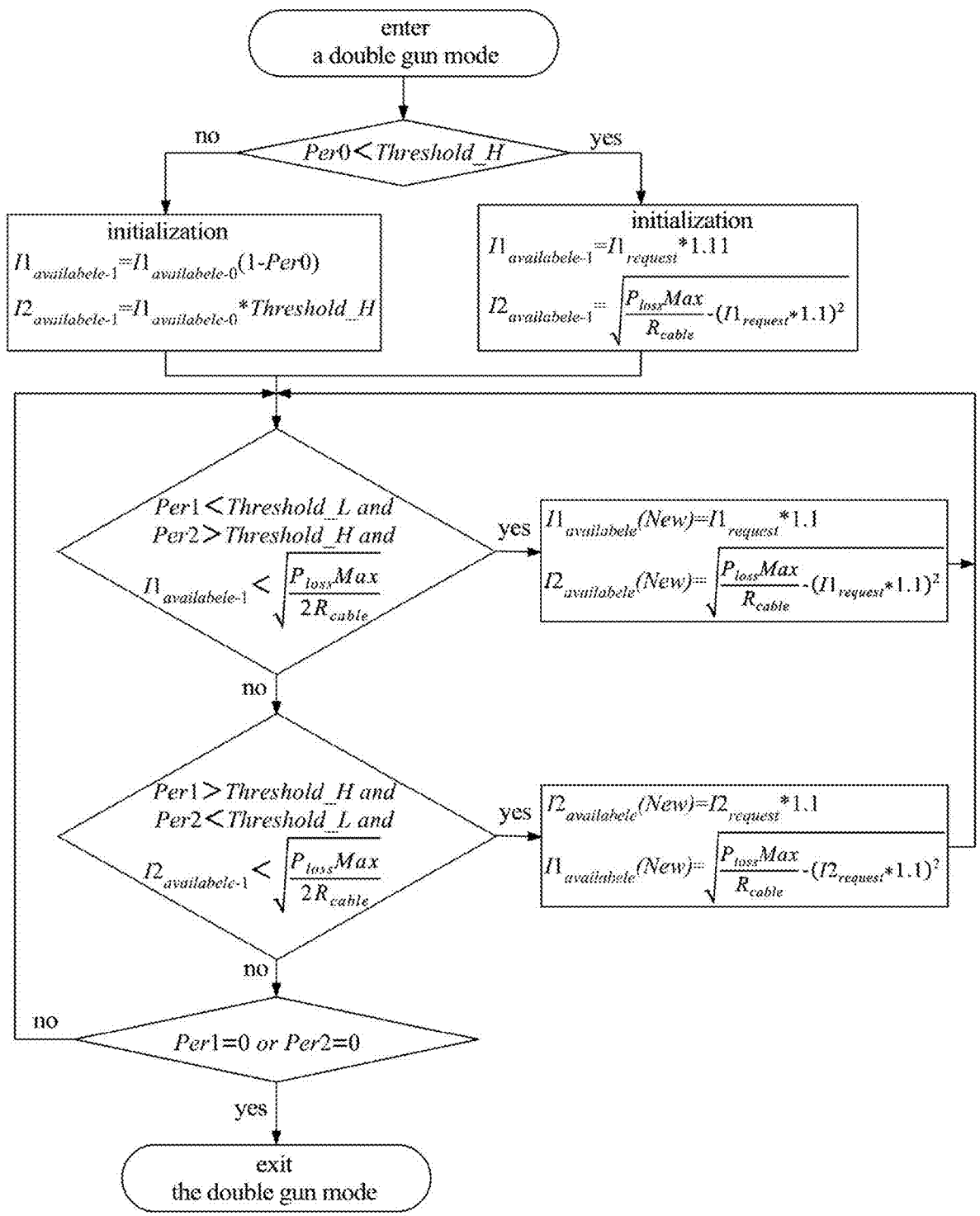
FIG. 4 is a flow chart of initializing the output currents of the double guns by real-time distribution when the charging pile equipped with double guns enters into a double gun mode from a single gun mode according to the disclosure.

FIG. 4 illustrates process of initializing the output currents of the double guns by real-time distribution when the double gun charging system shown in FIG. 1 enters into the double gun mode from the single gun mode. Assuming that the first charging gun 31 has been charging, the second charging gun 32 is entering into charging, and the output current of the second charging gun 32 is real-time distributed depending on a value of the output current of the first charging gun 31.

In FIG. 4, because the charging gun 2 is newly added, an original output current of the charging gun 2 is zero, and an original output current of the charging gun 1 is defined as $I1_{available-0}$, the initial output current is defined as $I1_{available-1}$, the request current is defined as $I1_{request}$, a ratio of the request current $I1_{request}$ and the original output current $I1_{available-0}$ is defined as Per0, i.e., $$Per0 = \frac{I1_{request}}{I1_{available-0}},$$

and a ratio of the request current $I1_{request}$ and the initial output current $I1_{available-1}$ is defined as Per1, i.e., $$Per1 = \frac{I1_{request}}{I1_{available-1}}.$$

The request current of the charging gun 2 is defined as $I2_{request}$, and the initial output current is defined as $I2_{available-1}$, with a ratio defined as Per2, i.e., $$Per2 = \frac{I2_{request}}{I2_{available-1}}.$$

The first current adjustment coefficient threshold is defined as Threshold_H, which may be, for example, 0.95. The second current adjustment coefficient threshold is defined as Threshold_L, which may be, for example, 0.80.

When the second charging gun 32 enters into charging, the system enters into the double gun mode from the single gun mode, and the respective output currents of the first charging gun 31 and the second charging gun 32 are initialized firstly. For example, when the output currents of the first charging gun 31 and the second charging gun 32 are initialized, the control unit 12 may determine respective initial output currents of the first charging gun 31 and the second charging gun 32 depending on the request current $I1_{request}$ and the original output current $I1_{available-0}$ of the first charging gun 31 that has been charging, the first current adjustment coefficient threshold Threshold_H, the maximum heat dissipation power $P_{loss}\text{Max}$ of the heat dissipation module 20 and the resistance $R_{cable}$ of each charging gun. If the initial output current of the first charging gun 31 is $I1_{available-1}$, and the initial output current of the second charging gun is $I2_{available-1}$, then if Per0<Threshold_H, then $I1_{available-1} = I1_{request} * 1.1$, and $$I2_{available-1} = \sqrt{\frac{P_{loss}\text{Max}}{R_{cable}} - (I1_{request} * 1.1)^2};$$

or, $I1_{available-1} = I1_{available-0}(1-\text{Per0})$, and $I2_{available-1} = I1_{available-0} * \text{Threshold\_H}$, such that initialization can be implemented.

After initialization, the control unit 12 may determine the output current of each of the two charging guns 30 depending on a request current of the respective charging gun, a first current adjustment coefficient threshold Threshold_H, a second current adjustment coefficient threshold Threshold_L, the maximum heat dissipation power $P_{loss}\text{Max}$ of the heat dissipation module 20 and a resistance $R_{cable}$ of each charging gun, wherein the first current adjustment coefficient threshold Threshold_H is larger than the second current adjustment coefficient threshold Threshold_L, such that the devices to be charged can be charged by the respective charging gun connected thereto simultaneously depending on the determined output current.

More specifically, when the first charging gun 31 and the second charging gun 32 charge simultaneously, if the first charging gun has a request current of $I1_{request}$ and an initial output current of $I1_{available-1}$, with a ratio of Per1; and if the second charging gun has a request current of $I2_{request}$ and an initial output current of $I2_{available-1}$, with a ratio of Per2, then:

if Per1<Threshold_L, Per2>Threshold_H, and $$I1_{available-1} < \sqrt{\frac{P_{loss}\text{Max}}{2R_{cable}}},$$

then $I1_{available}(\text{New}) = I1_{request} * 1.1$, and $$I2_{available}(\text{New}) = \sqrt{\frac{P_{loss}\text{Max}}{R_{cable}} - (I1_{request} * 1.1)^2};$$

if Per1>Threshold_L, Per2<Threshold_H, and $$I2_{available-1} < \sqrt{\frac{P_{loss}\text{Max}}{2R_{cable}}},$$

then $I2_{available}(\text{New}) = I2_{request} * 1.1$, and $$I1_{available}(New) = \sqrt{\frac{P_{loss}Max}{R_{cable}} - (I2_{request} * 1.1)^2} ;$$

wherein $I1_{available}(New)$ is an updated output current of the first charging gun 31, and $I2_{available}(New)$ is an updated output current of the second charging gun 32.

Moreover, when Per1=0, or Per2=0, the charging pile exits the double gun mode.

Taking the double gun system shown in FIG. 1 for example, several application scenarios of the charging pile of the present disclosure are explained in detail.

Application Scenario 1: Charging with Single Gun

When the demand current $I_{request}$ of the device (such as, an electric vehicle) is not larger than the maximum allowable output current $I_{available}Max$ of the single gun (i.e., $I_{request} < I_{available}Max$), the actual output current of the charging gun is:

$$I_{available} = I_{request}.$$

Application Scenario 2: Charging with Double Guns Simultaneously

When the first charging gun 31 and the second charging gun 32 charge simultaneously, if the first charging gun has a request current of $I1_{request}$ and an initial output current of $I1_{available-1}$, with a ratio of Per1; and if the second charging gun has a request current of $I2_{request}$ and an initial output current of $I2_{available-1}$, with a ratio of Per2, then:

if Per1<Threshold_L, Per2>Threshold_H, and $$I1_{available-1} < \sqrt{\frac{P_{loss}Max}{2R_{cable}}} ,$$

then $I1_{available}(New) = I1_{request} * 1.1$, and $$I2_{available}(New) = \sqrt{\frac{P_{loss}Max}{R_{cable}} - (I1_{request} * 1.1)^2} ;$$

if Per1>Threshold_L, Per2<Threshold_H, and $$I2_{available-1} < \sqrt{\frac{P_{loss}Max}{2R_{cable}}} ,$$

then $I2_{available}(New) = I2_{request} * 1.1$, and $$I1_{available}(New) = \sqrt{\frac{P_{loss}Max}{R_{cable}} - (I2_{request} * 1.1)^2} ;$$

wherein $I1_{available}(New)$ is an updated output current of the first charging gun 31, and $I2_{available}(New)$ is an updated output current of the second charging gun 32.

Application Scenario 3: Transiting from Charging with Single Gun to Charging with Double Guns Simultaneously Such application scenario is a dynamic process, where:
(1) the working principle of charging with a single gun is the same as that in the application scenario 1, and the working principle of charging with double guns simultaneously is the same as that in the application scenario 2;
(2) in a transition state, assuming that it is the second charging gun 32 that enters into charging (similar for the case in which it is the first charging gun 31 that enters into charging), with a demand current of $I2_{request}$, the system can be initialized in the following two manners:

Manner 1 (evenly distribution, as shown in FIG. 3): if the initial output current of the first charging gun 31 is $I1_{available-1}$, and the initial output current of the second charging gun 32 is $I2_{available-1}$, then $$I1_{available-1} = I2_{available-1} = \sqrt{\frac{P_{loss}Max}{2R_{cable}}} .$$

Manner 2 (real-time distribution, as shown in FIG. 4): if the original output current of the first charging gun 31 is $I1_{available-0}$, the initial output current is $I1_{available-1}$, the request current is $I1_{request}$, $$Per0 = \frac{I1_{request}}{I1_{available-0}},$$

and the initial output current of the second charging gun 32 is $I2_{available-1}$, then:
if Per0<Threshold_H, then $I1_{available-1} = I1_{request} * 1.1$, and $$I2_{available-1} = \sqrt{\frac{P_{loss}Max}{R_{cable}} - (I1_{request} * 1.1)^2} ;$$

or, $I1_{available-1} = I1_{available-0}(1-Per0)$, and $I2_{available-1} = I1_{available-0} * Threshold\_H$.

(3) when double guns charge simultaneously in a steady state, the working principle refers to the application scenario 2.

Application Scenario 4: Transiting from Charging with Double Guns Simultaneously to Charging with Single Gun Such application scenario is a dynamic process, where:
(1) when the double guns charge simultaneously, the working principle is the same as that in the application scenario 2, and when a single gun charges, the working principle is the same as that in the application scenario 1.
(2) in a transition state, assuming it is the second charging gun 32 that finishes charging (similar for the case in which it is the first charging gun 31 that finishes charging), the output current of the first charging gun 31 is:

$$I1_{available} = I1_{request}.$$

Although the charging pile and the power distribution method thereof in the disclosure are explained taking the double gun system shown in FIG. 1 as example, it should be understood that as for the charging pile including three or more charging guns, the working principle and the power distribution method are also applicable, and the details are not described here.

As shown in FIG. 5, the power distribution method 500 of the disclosure may comprise:

Step S51, determining, by a control unit, an output current of each charging gun depending on the maximum heat dissipation power $P_{loss}Max$ of the heat dissipation module and the maximum heat loss $P_{charger}Max$ of each charging gun, when the plurality of charging guns charge simultaneously. Wherein the maximum heat dissipation power $P_{loss}$Max of the heat dissipation module is equal to or larger than the maximum heat loss of any one of the charging guns, and is less than a sum of the individual maximum heat loss of each of the plurality of charging guns; and Step S52, distributing, by a power distribution unit, power supplied by a power module to a device through a charging gun connected thereto depending on the output current of each charging gun.

In some embodiments, the power distribution method 500 may further comprise: determining, by the control unit 12, an output current of a charging gun depending on a request current of the charging gun when the single charging gun charges, wherein the request current is a demand current of the device connected to the charging gun.

In some embodiments, when the plurality of charging guns 30 charge simultaneously, the control unit 12 determines the output current of each of the plurality of charging guns 30 depending on a request current of each charging gun, a first current adjustment coefficient threshold Threshold_H, a second current adjustment coefficient threshold Threshold_L, the maximum heat dissipation power $P_{loss}$Max of the heat dissipation module 20 and a resistance $R_{cable}$ of each charging gun, wherein the first current adjustment coefficient threshold Threshold_H is larger than the second current adjustment coefficient threshold Threshold_L.

In some embodiments, initialization of the individual output current of each of the plurality of charging guns is implemented by the control unit 12 by evenly distributing or real-time distributing the output currents of the charging guns when the charging pile 100 transits from charging with a single gun to charging with a plurality of guns simultaneously.

In some embodiments, the respective output current of the plurality of charging guns can be dynamically adjusted, which can ensure utilization of the liquid cooling heat dissipation module to the maximum extent for heat dissipation, such that an output efficiency and a heat dissipation efficiency of the charging pile can be improved effectively.

Exemplary embodiments of the disclosure have been shown and described above. It should be understood that the disclosure is not limited to the disclosed embodiments. Instead, the disclosure intends to cover various modifications and equivalent settings included in the spirit and scope of the appended claims.

What is claimed is:

1. A power distribution system of a charging pile, wherein the charging pile comprises a plurality of charging guns and a single heat dissipation module, all of the plurality of charging guns being connected to the heat dissipation module for heat dissipation, the power distribution system comprising:

a power module for supplying power to the plurality of charging guns;

a control unit connected to the power module and the heat dissipation module, and configured to determine, when the plurality of charging guns charge simultaneously, an output current of each charging gun depending on a maximum heat dissipation power $P_{loss}$Max of the heat dissipation module, wherein the maximum heat dissipation power $P_{loss}$Max of the heat dissipation module is equal to or larger than the maximum heat loss of any of the charging guns, and is less than a sum of individual maximum heat loss of each charging gun; and a power distribution unit connected to the power module and the control unit for distributing the power supplied by the power module to a device through the charging gun connected thereto depending on the output current of each charging gun;

the maximum heat dissipation power $P_{loss}$Max is the upper limit of the heat loss that the heat dissipation module can handle;

according to $P_{loss}$Max to determine the output current of each charging gun, that is suppress $I_{available}$Max in $P_{charger}$Max=$I_{available}^2$Max*$R_{cable}$, so that $P_{charger}$Max is less than $P_{loss}$Max, and the sum of $P_{charger}$Max of all charging guns is greater than $P_{loss}$Max.

2. The power distribution system according to claim 1, wherein the control unit is further configured to determine, when a single charging gun charges, an output current of the charging gun depending on a request current of the charging gun, wherein the request current is a demand current of the device corresponding to the charging gun.

3. The power distribution system according to claim 1, wherein when the plurality of charging guns charge simultaneously, the control unit determines the output current of each charging gun depending on a request current of each charging gun, a first current adjustment coefficient threshold Threshold_H, a second current adjustment coefficient threshold Threshold_L, the maximum heat dissipation power $P_{loss}$Max of the heat dissipation module and a resistance $R_{cable}$ of each charging gun, wherein the first current adjustment coefficient threshold Threshold_H is larger than the second current adjustment coefficient threshold Threshold_L.

4. The power distribution system according to claim 3, wherein the plurality of charging guns comprises a first charging gun and a second charging gun, the maximum allowable output currents $I_{available}$Max and the resistances $R_{cable}$ of the first charging gun and the second charging gun are the same, and the maximum heat loss $P_{charger}$Max of each charging gun satisfies:

$$P_{charger}\text{Max}=I_{available}^2\text{Max}*R_{cable}.$$

5. The power distribution system according to claim 4, wherein when the first charging gun and the second charging gun charge simultaneously, the first charging gun has a request current of $I1_{request}$ and an initial output current of $I1_{available\text{-}1}$, with a ratio of Per1; and the second charging gun has a request current of $I2_{request}$ and an initial output current of $I2_{available\text{-}1}$, with a ratio of Per2, then they satisfy:

if Per1>Threshold_H, Per2<Threshold_L, and $$I2_{availbale\text{-}1} < \sqrt{\frac{P_{loss}\text{Max}}{2R_{cable}}},$$

then $I2_{available}$(New)=$I2_{request}$*1.1, and $$I1_{available}(New) = \sqrt{\frac{P_{loss}\text{Max}}{R_{cable}} - (I2_{request}*1.1)^2};$$

if Per1<Threshold_L, Per2>Threshold_H, and $$I1_{available\text{-}1} < \sqrt{\frac{P_{loss}\text{Max}}{2R_{cable}}},$$

then $I1_{available}$(New)=$I1_{request}$*1.1, and $$I2_{available}(New) = \sqrt{\frac{P_{loss}\text{Max}}{R_{cable}} - (I1_{request}*1.1)^2} \; ;$$

wherein $I1_{available}(New)$ is an updated output current of the first charging gun, and $I2_{available}(New)$ is an updated output current of the second charging gun.

6. The power distribution system according to claim 5, wherein when the charging pile transits from charging with the first charging gun or the second charging gun to charging with the first charging gun and the second charging gun simultaneously, the control unit is further configured to implement initialization of output currents of the first charging gun and the second charging gun by evenly distributing the output currents of the charging guns.

7. The power distribution system according to claim 6, the control unit determines an initial output current of each charging gun depending on the maximum heat dissipation power $P_{loss}\text{Max}$ of the heat dissipation module and the resistance $R_{cable}$ of each charging gun, wherein the first charging gun is the charging gun that has been charging with an initial output current of $I1_{available-1}$, and the second charging gun is the charging gun that enters into charging with an initial output current of $I2_{available-1}$, then:

$$I1_{available-1} = I2_{available-1} = \sqrt{\frac{P_{loss}\text{Max}}{2R_{cable}}} \; .$$

8. The power distribution system according to claim 5, wherein when the charging pile transits from charging with the first charging gun or the second charging gun to charging with the first charging gun and the second charging gun simultaneously, the control unit is further configured to implement initialization of the output currents of the first charging gun and the second charging gun by real-time distributing the output currents of the charging guns.

9. The power distribution system according to claim 8, the control unit determines initial output currents of the first charging gun and the second charging gun depending on the request current and the original output current of the charging gun that has been charging, the first current adjustment coefficient threshold Threshold_H, the maximum heat dissipation power $P_{loss}\text{Max}$ of the heat dissipation module and the resistance $R_{cable}$ of each charging gun, wherein the first charging gun is the charging gun that has been charging, with the output current of $I1_{available-0}$, the request current of $I1_{request}$, a ratio of the request current $I1_{request}$ and the output current $I1_{available-0}$ of Per0, and the initial output current of $I1_{available-1}$; and the second charging gun is the charging gun that enters into charging with the initial output current of $I2_{available-1}$ then:

if Per0<Threshold_H, then $I1_{available-1} = I1_{request}*1.1$, and $$I2_{available-1} = \sqrt{\frac{P_{loss}\text{Max}}{R_{cable}} - (I1_{request}*1.1)^2} \; ;$$

else, $I1_{available-1} = I1_{available-0}(1-Per0)$, and $I2_{available-1} = I1_{available-0}*\text{Threshold\_H}$.

10. The power distribution system according to claim 1, wherein when the charging pile transits from charging with a single charging gun to charging with the plurality of charging guns simultaneously, the control unit is further configured to implement initialization of an individual output current of each charging gun by evenly distributing or real-time distributing the output currents of the charging guns.

11. A charging pile, comprising a plurality of charging guns and a single heat dissipation module, all of the plurality of charging guns being connected to the heat dissipation module for heat dissipation via heat exchange, wherein the charging pile comprises the power distribution system of claim 1.

12. A power distribution method for a charging pile, wherein the charging pile comprises a plurality of charging guns and a single heat dissipation module, all of the plurality of charging guns being connected to the heat dissipation module for heat dissipation, the power distribution method comprising:

determining, by a control unit, an output current of each charging gun depending on a maximum heat dissipation power $P_{loss}\text{Max}$ of the heat dissipation module, wherein the maximum heat dissipation power $P_{loss}\text{Max}$ of the heat dissipation module is equal to or larger than the maximum heat loss of any one of the charging guns, and is less than a sum of individual maximum heat loss of each charging gun; and distributing, by a power distribution unit, power supplied by a power module to a device through the charging gun connected thereto depending on the output current of each charging gun;

the maximum heat dissipation power $P_{loss}\text{Max}$ is the upper limit of the heat loss that the heat dissipation module can handle;

according to $P_{loss}\text{Max}$ to determine the output current of each charging gun, that is suppress $I_{available}\text{Max}$ in $P_{charger}\text{Max} = I_{available}^2\text{Max}*R_{cable}$, so that $P_{charger}\text{Max}$ is less than $P_{loss}\text{Max}$, and the sum of $P_{charger}\text{Max}$ of all charging guns is greater than $P_{loss}\text{Max}$.

13. The power distribution method according to claim 12, further comprising:

determining, by the control unit, an output current of a charging gun depending on a request current of the charging gun when the single charging gun charges, wherein the request current is a demand current of the device corresponding to the charging gun.

14. The power distribution method according to claim 12, wherein when the plurality of charging guns charge simultaneously, the control unit determines the output current of each charging gun depending on a request current of each charging gun, a first current adjustment coefficient threshold Threshold_H, a second current adjustment coefficient threshold Threshold_L, the maximum heat dissipation power $P_{loss}\text{Max}$ of the heat dissipation module and a resistance $R_{cable}$ of each charging gun, wherein the first current adjustment coefficient threshold Threshold_H is larger than the second current adjustment coefficient threshold Threshold_L.

15. The power distribution method according to claim 14, wherein the plurality of charging guns comprises a first charging gun and a second charging gun, the maximum allowable output currents $I_{available}\text{Max}$ and the resistances $R_{cable}$ of the first charging gun and the second charging gun are the same, and the maximum heat loss $P_{charger}\text{Max}$ of each charging gun satisfies:

$$P_{charger}\text{Max} = I_{available}^2\text{Max}*R_{cable}.$$

16. The power distribution method according to claim 15, wherein when the first charging gun and the second charging gun charge simultaneously, the first charging gun has a request current of $I1_{request}$ and an initial output current of $I1_{available-1}$, with a ratio of Per1; and the second charging gun has a request current of $I2_{request}$ and an initial output current of $I2_{available-1}$, with a ratio of Per2, then they satisfy:

if Per1>Threshold_H, Per2<Threshold_L, and $$I2_{available-1} < \sqrt{\frac{P_{loss}\text{Max}}{2R_{cable}}},$$

then $I2_{available}(New) = I2_{request} * 1.1$ and $$I1_{available}(New) = \sqrt{\frac{P_{loss}\text{Max}}{R_{cable}} - (I2_{request} * 1.1)^2};$$

if Per1<Threshold_L, Per2>Threshold_H, and $$I1_{available-1} < \sqrt{\frac{P_{loss}\text{Max}}{2R_{cable}}},$$

then $I1_{available}(New) = I1_{request} * 1.1$, and $$I2_{available}(New) = \sqrt{\frac{P_{loss}\text{Max}}{R_{cable}} - (I1_{request} * 1.1)^2};$$

wherein $I1_{available}(New)$ is an updated output current of the first charging gun, and $I2_{available}(New)$ is an updated output current of the second charging gun.

17. The power distribution method according to claim 16, further comprising:
  initializing, by the control unit, the output currents of the first charging gun and the second charging gun by evenly distributing the output currents of the charging guns when the charging pile transits from charging with the first charging gun or the second charging gun to charging with the first charging gun and the second charging gun simultaneously.

18. The power distribution method according to claim 17, the control unit determines an initial output current of each charging gun depending on the maximum heat dissipation power $P_{loss}\text{Max}$ of the heat dissipation module and the resistance $R_{cable}$ of each charging gun, wherein the first charging gun is the charging gun that has been charging with an initial output current of $I1_{available-1}$ and the second charging gun is the charging gun that enters into charging with an initial output current of $I2_{available-1}$, then:

$$I1_{available-1} = I2_{available-1} = \sqrt{\frac{P_{loss}\text{Max}}{2R_{cable}}}.$$

19. The power distribution method according to claim 16, further comprising:
  initializing, by the control unit, the output currents of the first charging gun and the second charging gun by real-time distributing the output currents of the charging guns when the charging pile transits from charging with the first charging gun or the second charging gun to charging with the first charging gun and the second charging gun simultaneously.

20. The power distribution method according to claim 19, the control unit determines initial output currents of the first charging gun and the second charging gun depending on the request current and the output current of the charging gun that has been charging, the first current adjustment coefficient threshold Threshold_H, the maximum heat dissipation power $P_{loss}\text{Max}$ of the heat dissipation module and the resistance $R_{cable}$ of each charging gun, wherein the first charging gun is the charging gun that has been charging, with the output current of $I1_{available-0}$, the request current of $I1_{request}$, a ratio of the request current $I1_{request}$ and the output current $I1_{available-0}$ of Per0, and the initial output current of $I1_{available-1}$; and the second charging gun is the charging gun that enters into charging with the initial output current of $I2_{available-1}$, then:

if Per0<Threshold_H, then $I1_{available-1} = I1_{request} * 1.1$, and $$I2_{available-1} = \sqrt{\frac{P_{loss}\text{Max}}{R_{cable}} - (I1_{request} * 1.1)^2};$$

else, $I1_{available-1} = I1_{available-0}(1-\text{Per0})$, and $I2_{available-1} = I1_{available-0} * \text{Threshold\_H}$.

21. The power distribution method according to claim 12, wherein when the charging pile transits from charging with a single charging gun to charging with the plurality of charging guns simultaneously, initialization of an individual output current of each charging gun is implemented by the control unit by evenly distributing or real-time distributing the output currents of the charging guns.

\* \* \* \* \*